US010277188B2

(12) United States Patent
Adkisson et al.

(10) Patent No.: US 10,277,188 B2
(45) Date of Patent: Apr. 30, 2019

(54) SWITCHABLE FILTERS AND DESIGN STRUCTURES

(71) Applicant: INTERNATIONAL BUSINESS MACHINES CORPORATION, Armonk, NY (US)

(72) Inventors: James W. Adkisson, Jericho, VT (US); Panglijen Candra, Essex Junction, VT (US); Thomas J. Dunbar, Burlington, VT (US); Mark D. Jaffe, Shelburne, VT (US); Anthony K. Stamper, Burlington, VT (US); Randy L. Wolf, Essex Junction, VT (US)

(73) Assignee: SMARTSENS TECHNOLOGY (CAYMAN) CO., LTD., Grand Cayman (KY)

( * ) Notice: Subject to any disclaimer, the term of this patent is extended or adjusted under 35 U.S.C. 154(b) by 0 days.

(21) Appl. No.: 15/971,257

(22) Filed: May 4, 2018

(65) Prior Publication Data
US 2018/0254761 A1 Sep. 6, 2018

Related U.S. Application Data

(60) Continuation of application No. 14/840,834, filed on Aug. 31, 2015, now Pat. No. 10,020,789, which is a
(Continued)

(51) Int. Cl.
*H03H 9/54* (2006.01)
*H03H 3/02* (2006.01)
(Continued)

(52) U.S. Cl.
CPC ......... *H03H 3/007* (2013.01); *G06F 17/5063* (2013.01); *H03H 3/02* (2013.01);
(Continued)

(58) Field of Classification Search
CPC ............... H03H 9/54; H03H 3/02; H03H 3/08
(Continued)

(56) References Cited

U.S. PATENT DOCUMENTS 6,078,229 A 6/2000 Funada et al.
6,232,847 B1 5/2001 Marcy, 5th et al.
(Continued)

FOREIGN PATENT DOCUMENTS

JP 59088618 A 5/1984

OTHER PUBLICATIONS

J.H. Kuypers et al. "Phase Velocity Control of Surface Acoustic Waves Based on Surface Shorting and Electrical Field Application Using MEMS Switches", Ultrasonics Symposium, 2007, IEEE, Digital Object Identifier: 10.1109/ULTSYM.2007.310, Publication Year: 2007, pp. 1233-1238.
(Continued)

*Primary Examiner* — Dean O Takaoka
(74) *Attorney, Agent, or Firm* — Eric Karich; Karich & Associates

(57) ABSTRACT

Switchable and/or tunable filters, methods of manufacture and design structures are disclosed herein. The method of forming the filters includes forming at least one piezoelectric filter structure comprising a plurality of electrodes formed to be in contact with at least one piezoelectric substrate. The method further includes forming a micro-electro-mechanical structure (MEMS) comprising a MEMS beam in which, upon actuation, the MEMS beam will turn on the at least one piezoelectric filter structure by interleaving electrodes in contact with the piezoelectric substrate or sandwiching the at least one piezoelectric substrate between the electrodes.

12 Claims, 11 Drawing Sheets

Related U.S. Application Data division of application No. 13/401,418, filed on Feb. 21, 2012, now Pat. No. 9,225,311.

(51) Int. Cl.

| | |
|---|---|
| *H03H 3/08* | (2006.01) |
| *H03H 3/007* | (2006.01) |
| *H03H 9/56* | (2006.01) |
| *H03H 9/10* | (2006.01) |
| *H03H 9/24* | (2006.01) |
| *G06F 17/50* | (2006.01) |
| *H03H 9/02* | (2006.01) |
| *H03H 9/64* | (2006.01) |
| *H03H 9/15* | (2006.01) |

(52) U.S. Cl.
CPC .......... *H03H 3/08* (2013.01); *H03H 9/02007* (2013.01); *H03H 9/02992* (2013.01); *H03H 9/1071* (2013.01); *H03H 9/2447* (2013.01); *H03H 9/2452* (2013.01); *H03H 9/2457* (2013.01); *H03H 9/2463* (2013.01); *H03H 9/54* (2013.01); *H03H 9/56* (2013.01); *H03H 9/64* (2013.01); *H03H 9/02244* (2013.01); *H03H 2003/022* (2013.01); *H03H 2003/023* (2013.01); *H03H 2003/027* (2013.01); *H03H 2009/155* (2013.01); *Y10T 29/42* (2015.01); *Y10T 29/49005* (2015.01); *Y10T 29/49155* (2015.01)

(58) Field of Classification Search
USPC .......................................... 333/193
See application file for complete search history.

(56) References Cited

U.S. PATENT DOCUMENTS

| | | | |
|---|---|---|---|
| 6,541,893 B2 | 4/2003 | Zhu et al. | |
| 6,933,808 B2 | 8/2005 | Ma et al. | |
| 6,954,020 B2 | 10/2005 | Ma et al. | |
| 7,160,476 B2 | 1/2007 | Weekamp | |
| 7,227,433 B2 | 6/2007 | Ginsburg et al. | |
| 7,243,547 B2 | 7/2007 | Cobianu et al. | |
| 7,272,801 B1 | 9/2007 | Kamon et al. | |
| 7,456,707 B2 | 11/2008 | Tsurumi et al. | |
| 7,476,567 B2 | 1/2009 | Sato | |
| 7,514,759 B1 | 4/2009 | Mehta et al. | |
| 7,556,978 B2 | 7/2009 | Liu | |
| 7,592,739 B2 | 9/2009 | Robert | |
| 8,160,526 B2 | 4/2012 | Ecoff | |
| 8,164,757 B2 | 4/2012 | Yamanoi et al. | |
| 8,174,342 B2* | 5/2012 | Min | H01H 50/005 333/262 |
| RE43,958 E | 2/2013 | Noguchi et al. | |
| 8,436,698 B2 | 5/2013 | Rogers | |
| 8,471,651 B2 | 6/2013 | Huang et al. | |
| 8,987,973 B2* | 3/2015 | Mukter-Uz-Zaman | H02N 2/186 310/339 |
| 9,048,809 B2 | 6/2015 | Adkisson et al. | |
| 9,054,671 B2 | 6/2015 | Adkisson et al. | |
| 9,099,982 B2 | 8/2015 | Adkisson et al. | |
| 9,225,311 B2 | 12/2015 | Adkisson et al. | |
| 9,252,733 B2 | 2/2016 | Adkisson et al. | |
| 9,843,303 B2 | 12/2017 | Adkisson et al. | |
| 9,843,600 B1 | 12/2017 | Yu | |
| 9,935,600 B2 | 4/2018 | Adkisson et al. | |
| 10,020,789 B2* | 7/2018 | Adkisson | G06F 17/5063 |
| 10,164,597 B2* | 12/2018 | Adkisson | G06F 17/5063 |
| 2002/0043891 A1 | 4/2002 | Takahashi et al. | |
| 2006/0131731 A1 | 6/2006 | Sato | |
| 2006/0181368 A1 | 8/2006 | Naniwada | |
| 2008/0230859 A1 | 9/2008 | Zaghloul et al. | |
| 2010/0127596 A1 | 5/2010 | Ayazi et al. | |
| 2010/0194246 A1 | 8/2010 | Wang et al. | |
| 2010/0254547 A1 | 10/2010 | Grosh et al. | |
| 2010/0320873 A1 | 12/2010 | Fujita et al. | |
| 2011/0012478 A1 | 1/2011 | Najafi et al. | |
| 2013/0113577 A1 | 5/2013 | Adkisson et al. | |
| 2013/0169383 A1 | 7/2013 | Adkisson et al. | |
| 2013/0235001 A1 | 9/2013 | Yun et al. | |
| 2016/0182009 A1 | 6/2016 | Bhattacharjee | |
| 2017/0366153 A1 | 12/2017 | Adkisson et al. | |

OTHER PUBLICATIONS

E. Quevy et al. "IF MEMS Filters for Mobile Communication", IEEE, 2001, pp. 733-736.

W. Pang et al. "Electrically Tunable and Switchable Film Bulk Acoustic Resonator", IEEE International, Ferroelectrics and Frequency Control Symposium and Exposition, 2004, pp. 22-26.

F. Ayazi "MEMS for Integrated Timing and Spectral Processing", IEEE, Center for MEMS and Microsystems Technology Georgia Institute of Technology, Atlanta, GA, 2009, pp. 65-72.

S. Aliouane et al. "RF-MEMS Switchable Inductors for Tunable Bandwidth BAW Filters", pp. 1-6, Design and Technology of Integrated Systems in Nanoscale Era (DTIS), 2010.

\* cited by examiner

SWITCHABLE FILTERS AND DESIGN STRUCTURES

FIELD OF THE INVENTION

The invention relates to semiconductor structures and methods of manufacture and, more particularly, to switchable and/or tunable filters, methods of manufacture and design structures.

BACKGROUND

SAW (surface acoustic wave) filters play a key role in telecommunications. For example, SAW filters are widely used as bandpass and spectrum-shaping filters in mobile and wireless applications. Other applications for SAW filters include wide area networks (WAN), wireless local area network (WLAN) communications, cordless phones, pagers and satellite communications. SAW filters are preferable to conventional LC filters as they are much smaller, cheaper and more versatile, making them ideal for telecommunication applications.

In SAW filters, electrical signals are converted to a mechanical wave in a device constructed of a piezoelectric crystal or ceramic. The wave is delayed as it propagates across the device, before being converted back to an electrical signal by other electrodes. More specifically, coupling between surface waves and electrical signals is achieved by interdigital (interleaved) transducers (IDTs). A simple form of the IDT consists of parallel fingers alternately connected to opposite electrodes to which the signal is applied.

For example, when an AC voltage is applied to input transducers (electrodes), due to piezoelectricity, the transducer produces mechanical deformation of the piezoelectric substrate surface. This, in turn, results in a surface acoustic wave traveling on the surface of the piezoelectric substrate until reaching the output IDT, where it is transformed back to an electrical signal. When this wave reaches the output IDT, the electric field will induce a potential difference between neighboring electrodes such that the output IDT will convert the mechanical vibration into output voltages.

SAW filters can be designed to provide quite complex signal processing functions within a single package containing only a piezoelectric substrate with superimposed thin metal film input and output interdigital transducers (IDTs). SAW filters can be mass-produced using semiconductor microfabrication techniques, which enables the outstanding reproducibility of the SAW filters. However, programming or tuning of the SAW filters has been found to be difficult to achieve.

BAW (Bulk Acoustic Wave) filters are electromechanical devices, which typically operate at frequencies from around 2 GHz to around 16 GHz, and may be smaller or thinner than equivalent SAW filters. The BAW filter can be a Thin Film Bulk Acoustic Resonator (FBAR or TFBAR), which is a device consisting of a piezoelectric material sandwiched between two electrodes and acoustically isolated from the surrounding medium. FBAR devices using piezoelectric films can be used as radio frequency (RF) filters for use in cell phones and other wireless applications. FBARs can also be used in a variety of other applications such as microwave oscillators and sensor applications.

FBARs utilize the acoustic resonant characteristics of piezoelectric materials, much like SAW filters, to remove unwanted frequencies from being transmitted in a device, while allowing other specific frequencies to be received and transmitted. To adjust the acoustic resonant characteristics of the FBAR, thickness of the piezoelectric film can be adjusted. Alternatively or in addition, the FBAR can be put under a mechanical load so that its resonance frequency can shift. This is known as a mass loading effect. The mass loading effect can be accomplished by depositing or growing a mass of film on the resonator to bring about downshifting of the resonance frequency of the FBAR. The mass loading is carried out by growing or depositing of a thin film material uniformly distributed on one electrode of the resonator, covering the active surface of the device. The thin film can be a dielectric material or a metal material, depending on the design criteria. However, much like in the SAW application, programming or tuning of the BAW filter has been found to be difficult to achieve.

Accordingly, there exists a need in the art to overcome the deficiencies and limitations described hereinabove.

SUMMARY

In a first aspect of the invention, a method comprises forming at least one piezoelectric filter structure comprising a plurality of electrodes formed to be in contact with at least one piezoelectric substrate. The method further comprises forming a micro-electro-mechanical structure (MEMS) comprising a MEMS beam in which, upon actuation, the MEMS beam will turn on the at least one piezoelectric filter structure by interleaving electrodes in contact with the piezoelectric substrate or sandwiching the at least one piezoelectric substrate between the electrodes.

In another aspect of the invention, a method comprises determining a frequency of a filter or need to have the filter activated. The method further comprises turning on one or more filters by actuating a MEMS beam by interleaving electrodes in contact with the piezoelectric substrate or sandwiching the at least one piezoelectric substrate between the electrodes, in response to the determining.

In another aspect of the invention, a filter comprises at least one filter comprising a plurality of electrodes formed to be in contact with at least one piezoelectric substrate. The filter further comprises a beam structure positioned to turn on the at least one filter by moving the MEMS beam such that electrodes become interleaved in contact with the at least one piezoelectric substrate or the at least one piezoelectric substrate becomes sandwiched between the electrodes.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the switchable filter structures, which comprises the structures of the present invention. In still further embodiments, a method in a computer-aided design system is provided for generating a functional design model of the switchable filter structures. The method comprises generating a functional representation of the structural elements of the switchable filter structures.

More specifically, in embodiments, a method is provided in a computer-aided design system for generating a functional design model of a switchable filter structure. The method comprises generating a functional representation of at least one filter comprising a plurality of electrodes formed to be in contact with at least one piezoelectric substrate; and generating a function representation of a beam structure positioned to turn on the at least one filter by moving the MEMS beam such that electrodes become interleaved in contact with the at least one piezoelectric substrate or the at least one piezoelectric substrate becomes sandwiched between the electrodes.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention. Unless otherwise specified herein, the drawings are not to scale.

DETAILED DESCRIPTION

Figure 1:
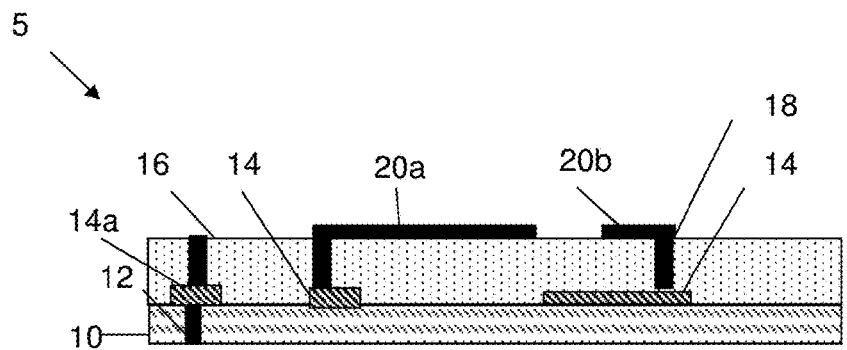
FIGS. 1-4 show fabrication processes and respective structures for fabricating a SAW filter structure in accordance with aspects of the present invention.

The invention relates to semiconductor structures and methods of manufacture and, more particularly, to switchable and/or tunable filters, methods of manufacture and design structures. In embodiments, the switchable and/or tunable filter structures of the present invention include, for example, Surface Acoustic Waver (SAW) filters and Bulk Acoustic Wave (BAW) filters. In embodiments, the filter structures of the present invention are structured to be switchable between an "on" state and an "off" state using, for example, a Micro-Electro-Mechanical System (MEMS) structure.

More specifically, the SAW filter structures of the present invention include interdigitized or interleaved electrodes (also referred to as wiring layers) formed on one or more piezoelectric substrates or an insulator layer facing the piezoelectric substrate or combinations thereof. In embodiments, the interleaved electrodes of the SAW filter include a ground electrode interleaved with either a Vin signal electrode or Vout signal electrode to form input and output IDTs, respectively. The BAW filter, on the other hand, includes one or more piezoelectric substrates sandwiched between an upper electrode and a lower electrode.

In embodiments, the SAW filter (or any of a multitude of SAW filters) or the BAW filter of the present invention can be turned "on" and "off" using a MEMS beam structure. For example, in a SAW filter structure, a signal electrode can be provided on the MEMS beam structure and a ground electrode can be provided on the fixed plate (or vice versa). Also, in embodiments, the signal electrode and the fixed plate can be formed on piezoelectric substrates, or an insulator substrate, or a combination thereof, in many different configurations. Upon actuation of the MEMS beam structure, the signal electrode will become interleaved with the ground electrode to provide an "on" state for the SAW filter structure. In a series SAW filter configuration, the MEMS beam structure can tune the filter, by turning on and off selected SAW filter structures.

In the BAW structure, the MEMS beam structure can, for example, be either a metal plate (electrode) or a piezoelectric substrate formed on a metal plate, in many different configurations. Upon actuation of the MEMS beam structure, the piezoelectric substrate will become sandwiched between two metal plates (electrodes). In this way, the BAW filter can be turned "on". In addition, multiple filters can be arranged in series for band switching/tuning. In such implementation, selected filters can be turned on and off by actuation of the MEMS beam structure. The MEMS beam structure can also be used in combination with a loading mass (e.g., loading bar), for example, to apply a mechanical load on the BAW filter structure, thus shifting its resonant frequency.

As in any of the embodiments, the MEMS beam structure can be expanded to a variety of voltages, heights, cantilever geometries, layouts, stiction points, etc., in order to turn on and off the filter structures (e.g., SAW or BAW filter structures). Also, the MEMS beam structure can be fabricated using conventional CMOS processes. In general, the MEMS beam structure utilizes the methodologies and tools used to form small structures with dimensions in the micrometer scale with dimensions of approximately 5 µm thick, 100 µm wide, and 400 µm long; although other dimensions are also contemplated by the present invention as discussed herein. For example, the MEMS beam structure can be realized in thin films of materials patterned by photolithographic processes and fixed at one end to an insulator material, and suspended within a cavity. In particular, the fabrication of the MEMS beam structure can implement: (i) deposition of thin films of material on a substrate (e.g., insulator layer), (ii) apply a patterned mask on top of the films by photolithographic imaging, and (iii) etch the films selectively to the mask.

FIGS. 1-4 show fabrication processes and respective structures for fabricating a SAW filter structure in accordance with aspects of the present invention. More specifically, FIG. 1 shows a structure 5, which includes a substrate 10. In embodiments, the substrate 10 can be any insulator material or other type of device substrate. An interconnect 12 is provided through the substrate 10. The interconnect 12 can be, for example, a tungsten or copper stud formed in a conventionally formed via. For example, the interconnect 12 can be formed using any conventional photolithographic, etching and deposition processes, known to those of skill in the art for forming studs, such as a damascene process. The interconnect 12 could contact other wiring levels, CMOS transistors or other active devices, passive devices, etc., as known in the art.

Still referring to FIG. 1, a wiring layer is deposited and patterned to form a plurality of wires 14. More specifically, the wires 14 can be formed by an additive or subtractive process. For example, in a subtractive process, the wires 14 can be formed by depositing a metal layer on the substrate 10, and patterning the metal layer using conventional photolithographic and etching (e.g., reactive ion etching (RIE)) processes. The metal layer can be any conductive metal or alloy thereof. For example, the metal layer can be, for example, aluminum, gold or copper; although other metals are contemplated by the present invention. In embodiments, the wires 14 can have a thickness of about 1 micron to about 3 microns; although other dimensions are also contemplated by the present invention. In embodiments, wire 14a will be formed in contact with the interconnect 12.

In FIG. 1, an insulator layer 16 is deposited over the wires 14. The insulator layer 16 can be any insulator layer such as, for example, an oxide based material ($SiO_2$) or other inter-level dielectric material known to those of skill in the art. The insulator layer 16 can be deposited using any conventional deposition process, e.g., chemical vapor deposition (CVD). For example, deposition options for the insulator layer 16 (or any insulator layer in aspects of the invention) include one or more of plasma-enhanced CVD (PECVD), sub-atmospheric CVD (SACVD), atmospheric pressure CVD (APCVD), high density plasma CVD (HDPCVD), physical vapor deposition (PVD), or atomic layer deposition (ALD) at temperatures compatible with other materials of the structure. In embodiments, the insulator layer 16 is deposited at temperatures compatible with metal wiring, e.g., aluminum wiring, e.g., under about 420° C. and preferably under about 400° C.

In embodiments, the insulator layer 16 is deposited to a depth of about 80 nm; although other dimensions are also contemplated by the present invention. In embodiments, the insulator layer 16 can be patterned using conventional photolithographic and etching processes to form a pattern (e.g., openings). In embodiments, the openings are aligned with the underlying wires 14. A metal material is then deposited in the openings to form stud contacts 18. The metal material can be any metal material compatible with the wires 14.

A metal wiring layer, i.e., wiring 20a, 20b, is formed on the insulator layer 16 using conventional additive or subtractive processes as described herein, e.g., deposition and patterning. In embodiments, the wiring 20a can be a signal electrode interleaved with a ground electrode of a SAW filter structure; whereas, the wiring 20b can be a fixed actuator electrode for a MEMS beam structure. It is contemplated by the present invention that any of the wiring layers (wiring layers 20a, 20b, etc.) can be formed using the processed described herein, to a depth of about 0.05 to 4 μm and preferably to a depth of 0.25 μm; although other dimensions are also contemplated by the present invention. In embodiments, the wiring layers of all aspects of the present invention can be a refractory metal such as Ti, TiN, TiN, Ta, TaN, and W and the like, or AlCu, or a noble metal such as, for example, Au, Pt, Ru, Ir, and the like amongst other wiring materials. For example, in embodiments, the wiring layers could be formed from pure refractory metals, or aluminum or an aluminum alloy such as AlCu, AlSi, or AlCuSi.

Figure 2:
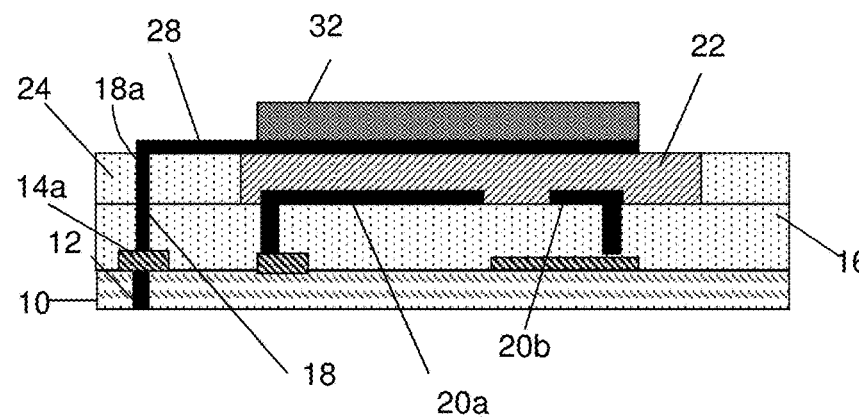

In FIG. 2, a sacrificial material 22 such as, for example, PMGI (polydimethylglutarimide polymer) or silicon (or any other material that can be selectively removed in later processing steps), is deposited over the wiring layers 20a, 20b. The sacrificial material 22 can be patterned using conventional photolithographic and etching (RIE) processes. In embodiments, the sacrificial material 22 has a thickness of about 2 microns, although other dimensions are also contemplated by the present invention.

An insulator layer 24 is deposited on the structure, and planarized to expose the sacrificial material 22. The insulator layer 24 can be deposited in the manner described herein, e.g., similar to that used for the insulator layer 16. In alternate embodiments, the insulator layer 24 can be deposited and patterned to form an opening, in which the sacrificial material 22 can be deposited therein. In either fabrication scenario, the present invention contemplates that the sacrificial material 22 can be planarized. The planarization can be performed by a chemical mechanical process (CMP), known to those of skill in the art. In one non-limiting example, the insulator layer 24 is patterned to form an opening. A metal stud 18a is formed in the opening, in contact with the stud contact 18. In embodiments, the stud 18a can be fabricated in the same manner as stud contact 18, using the same types of materials and processes.

Still referring to FIG. 2, a wiring layer 28 is formed in electrical contact with the stud 18, and over the insulator material 24 and the sacrificial material 22. In embodiments, the wiring layer is patterned into a MEMS beam structure 28 which can be a metal layer or a composite beam structure, formed by a deposition of metal, oxide, metal or, alternative, an oxide, metal, oxide. In embodiments, the MEMS beam structure 28 can be any appropriate metal, e.g., TiN, TaN, Al, etc. In embodiments, the wiring 20b will act as an actuator to pull-in the MEMS beam structure 28, as will be described in further detail herein.

A piezoelectric layer 32 is deposited and patterned on the MEMS beam structure 28 using conventional deposition and patterning processes. In embodiments, the piezoelectric layer 32 can be composed of any known piezoelectric material. For example, the piezoelectric layer 32 can AlN, ZnO, quartz, $LiNbo_3$, $LiTiO_3$, Pb $(Zr_xTi_{1-x})O_3$, $PbTiO_3$, a piezo-polymer material, e.g., $PVD-[Ch_2-CF_2]_n$ or composite materials such as PVDF and PZT materials. It should be understood by those of skill in the art, that the signal electrode and/or the ground electrode (wiring layer 20a) can be formed on the underside of the piezoelectric layer 32, using conventional deposition and patterning processes (see, e.g., FIGS. 5a-5d). In such configuration, the wiring layer 20a can be formed on the sacrificial material 22, with the piezoelectric layer 32 deposited and patterned over the wiring layer 20a.

Figure 3:
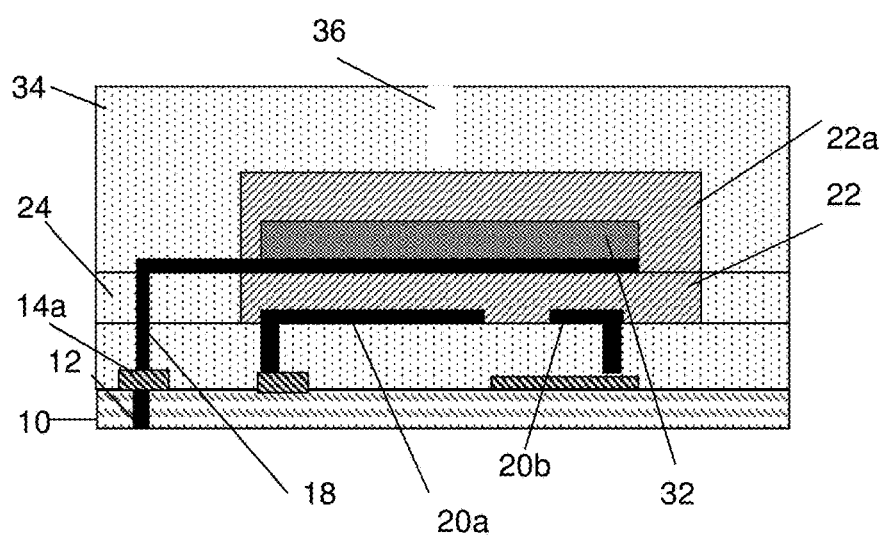

In FIG. 3, a sacrificial material 22a is deposited on the piezoelectric layer 32, in direct contact with the sacrificial material 22. In embodiments, the sacrificial material 22a is PMGI or silicon (or any other selective material that can be selectively removed at a later processing step), formed in a manner already described herein such that no further explanation is required. In embodiments, the sacrificial material 22a can have a depth of about 2 microns; although other dimensions are also contemplated by the present invention.

Insulator layer 34 is formed on the sacrificial material 22a and any other exposed surfaces, e.g., piezoelectric layer 32 and wiring layer 28 and insulator layer 24. The insulator layer 34 can be formed from an oxide material, deposited in the manner as already described herein. One or more vent holes 36 are formed in the insulator layer 34 using conventional photolithographic and etching processes. In embodiments, the one or more vent holes 36 are patterned and opened in the insulator layer 34, exposing a portion of the sacrificial material 22a. The width and height of the one or more vent holes 36 determines the amount of material that should be deposited after venting to pinch off the one or more vent holes 36. The one or more vent holes 36 may be circular or nearly circular to minimize the amount of subsequent material needed to pinch it off.

Figure 4:
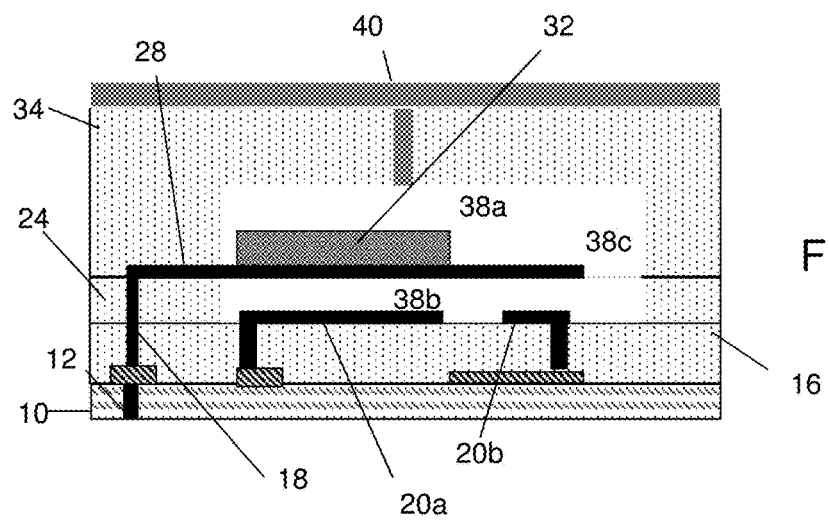

In FIG. 4, as with all of the aspects of the invention, the sacrificial material is vented or stripped away using an etchant that is selective to removing of the sacrificial material through the vent hole 36, e.g., $XeF_2$. In embodiments, this etching will form an upper cavity or chamber 38a, a lower cavity or chamber 38b and a connecting via 38c. The vent holes 36 can be sealed with material 40, such as a dielectric material or metal. To avoid an issue of sealing material entering the cavity and depositing on the MEMS beam structure, in embodiments, the vent holes 36 can be strategically placed away from the MEMS beam structure (e.g., beam structure 28 and piezoelectric layer 32 formed on the beam structure), so that no vent hole sealing material is deposited on the released beam.

Figure 5A:
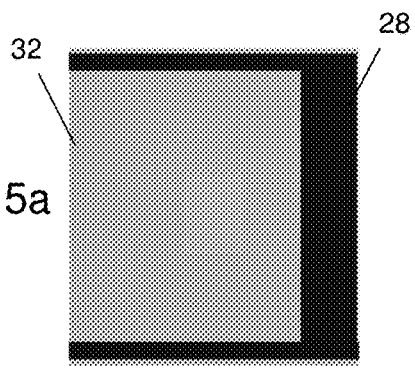
FIGS. 5a-5d show exploded views of alternate configurations of the SAW filter structure of FIG. 4, in accordance with aspects of the present invention.
Figure 5C:
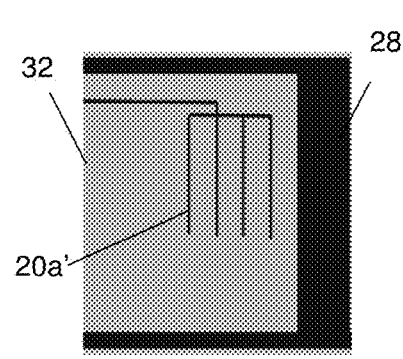
Figure 5B:
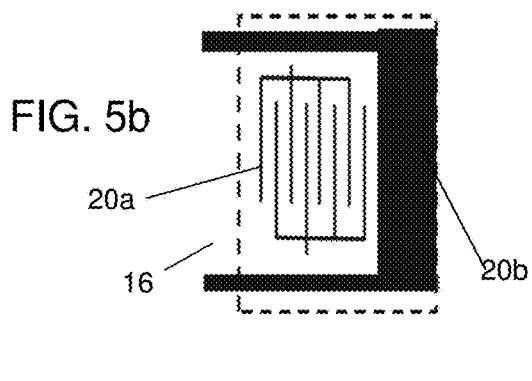

FIGS. 5a-5d show exploded views with alternate structures of the SAW filter structure of FIG. 4, in accordance with aspects of the present invention. More specifically, FIG. 5a shows an underside of the piezoelectric layer 32 and MEMS beam structure 28. As in all of the aspects of the present invention, the MEMS beam structure can be a cantilever beam or a bridge beam (as represented by any of the relevant figures herein). As shown in this representation, the piezoelectric layer 32 is formed within an opening of the MEMS beam structure 28. In FIG. 5b, the wiring 20a, e.g., interleaved signal electrode and ground electrode, is formed below the exposed piezoelectric layer 32, on the insulator layer 16. The actuator 20b is also shown to be formed on the insulator layer 16, which will face the MEMS beam structure 28. In this configuration, upon actuation of the MEMS beam structure 28, the piezoelectric layer 32 will contact the interleaved signal electrode and ground electrode 20a to form a SAW filter in the "on" state.

Figure 5D:
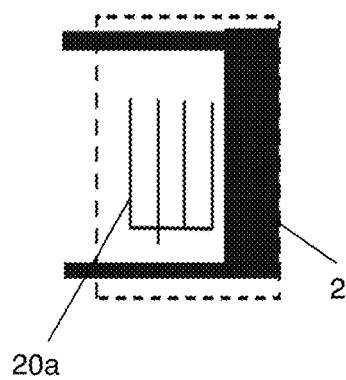

In FIGS. 5c and 5d, the signal electrode 20a' is formed on an underside of the piezoelectric layer 32; whereas, the ground electrode 20a, is formed on the insulator layer 16. Of course, it should be understood by those of skill in the art that the ground electrode can be formed on an underside of the piezoelectric layer 32 and the signal electrode can be formed on the insulator layer 16. The signal electrode 20a' can be formed using any conventional deposition and patterning processes. In this configuration, for example, the signal electrode 20a' would be formed on the sacrificial material, prior to the formation of the MEMS beam structure.

Figure 6:
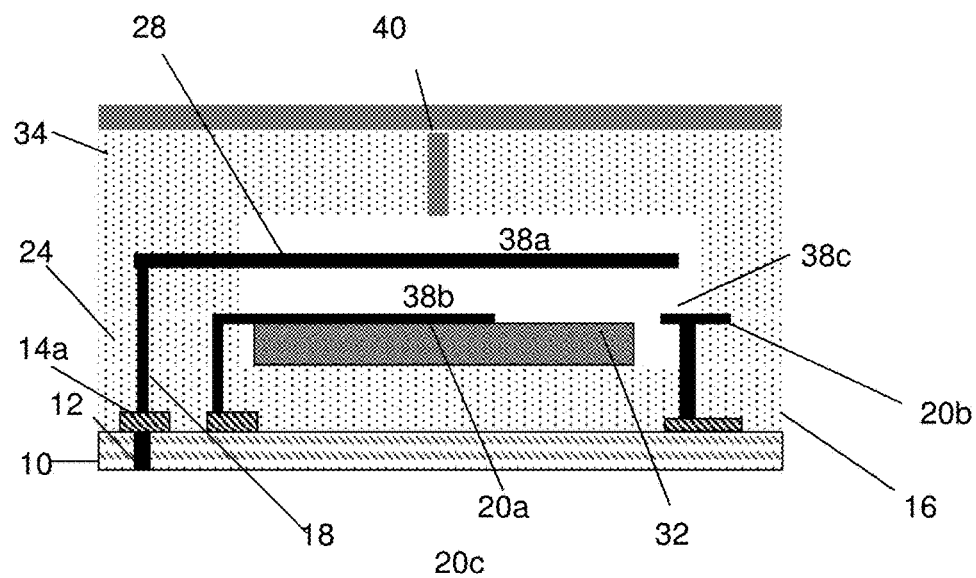
FIG. 6 shows an alternate SAW filter structure and respective fabrication processes in accordance with aspects of the present invention.
Figure 7A:
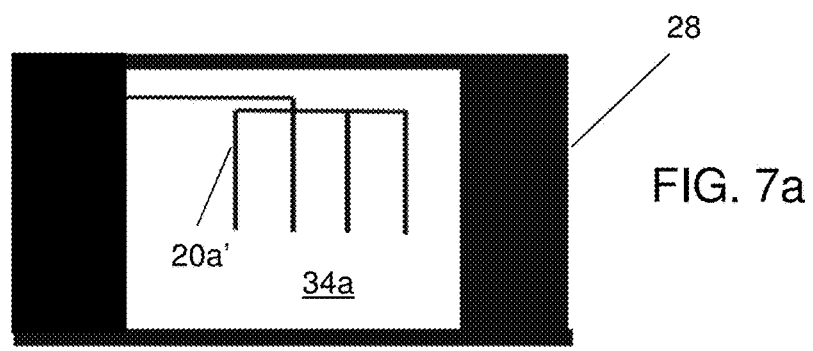
FIGS. 7a and 7b show exploded views with alternate configurations of the SAW filter structure of FIG. 6, in accordance with aspects of the present invention.
Figure 7B:
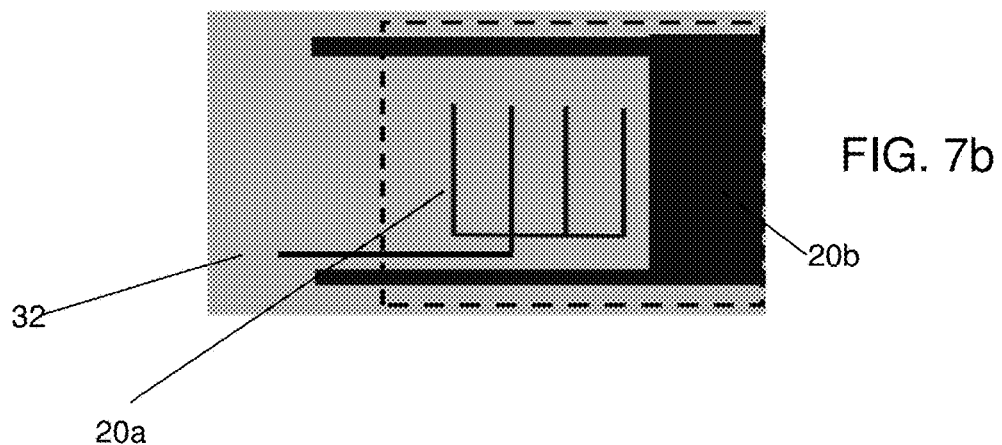

FIG. 6 shows a SAW filter structure and respective fabrication processes in accordance with aspects of the present invention. FIGS. 7a-7b show exploded views of the SAW filter structure of FIG. 6. In FIG. 6, the piezoelectric layer 32 is formed on the insulator layer 16, in contrast to the MEMS beam structure 28 (shown in FIG. 4). As shown in FIGS. 6, 7a and 7b, the MEMS beam 28 and the wiring layer 20a' are ground. The wiring layer 20a' is formed on an underside of the insulator layer 34a, and the MEMS beam structure 28 surrounds the wiring layer 20a'. That is, the wiring layer 20a' is formed within an opening of the MEMS beam structure 28. It should also be understood by those of skill in the art, that the wiring layer 20a' may be suspended within the opening of the MEMS beam structure 28, as also represented by reference numeral 34a.

As shown in FIG. 7b, the wiring layer 20a is provided on the piezoelectric layer 32, and represents a signal wiring. Also, FIG. 7b shows the actuator 20b, which is aligned with the MEMS beam structure 28. In this structure, the wiring layer 20a can be the signal electrode and the wiring layer 20a' can be the ground electrode. As in the previous embodiment, upon actuation of the MEMS beam structure 28, the signal electrode will become interleaved with the ground electrode to form a SAW filter in the "on" state.

Figure 8:
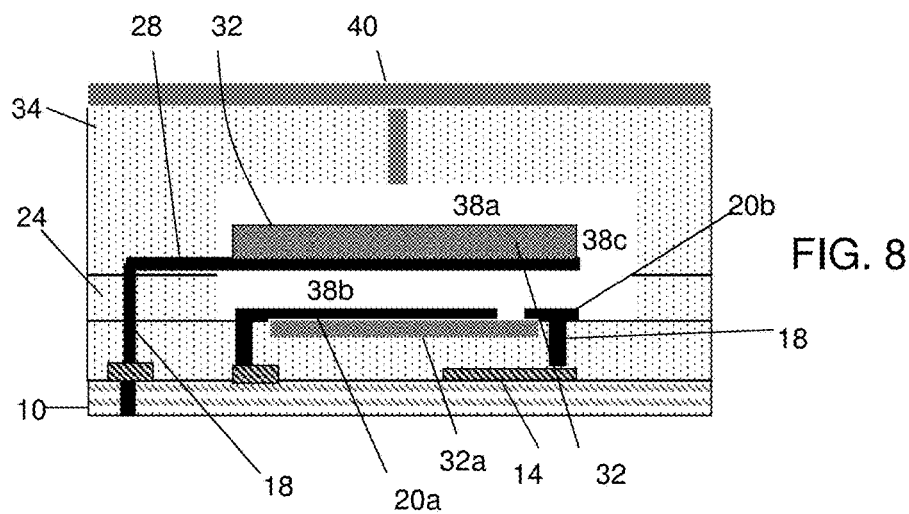
FIG. 8 shows an alternate SAW filter structure and respective fabrication processes in accordance with aspects of the present invention.

FIG. 8 shows an alternate SAW filter structure and respective processing steps in accordance with aspects of the present invention. More specifically, in FIG. 8, a piezoelectric layer 32a is formed under the wiring layer 20a. The piezoelectric layer 32a can be any piezoelectric material as already discussed herein. In embodiments, the piezoelectric layer 32a can be formed after the deposition of the insulator layer 16 and prior to the formation, e.g., deposition and patterning, of the wiring layer 20a. The piezoelectric layer 32a can be formed using conventional deposition and patterning processes, such that no further explanation is required herein. It should be understood by those of skill in the art that the piezoelectric layer 32a can be formed of the same or different material than the piezoelectric layer 32. Such combination of piezoelectric layers can be used in any aspect of the invention that implements two or more piezoelectric layers.

Figure 9A:
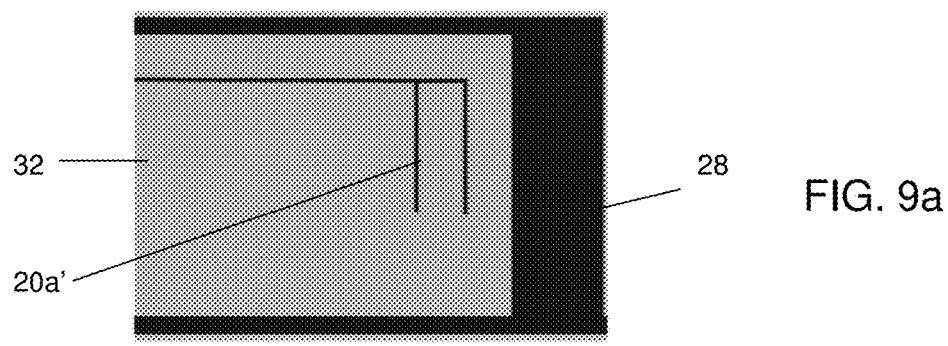
FIGS. 9a and 9b show exploded views with configurations of the SAW filter structure of FIG. 8, in accordance with aspects of the present invention.
Figure 9B:
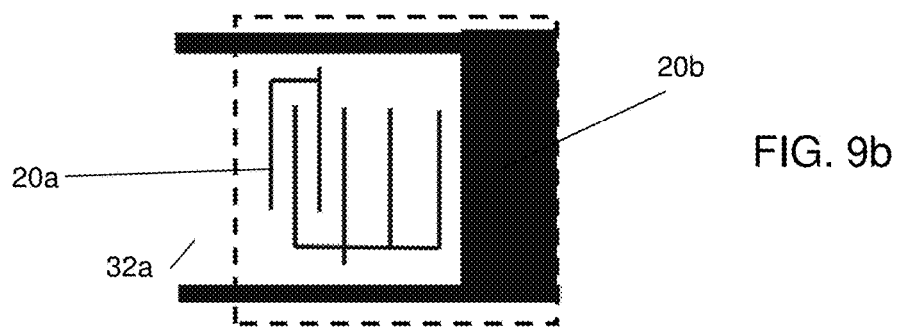

FIGS. 9a and 9b show exploded views of the SAW filter structure of FIG. 8. As shown in FIGS. 9a and 9b, a portion of the wiring layer 20a' is formed under the underside of the piezoelectric layer 32; whereas, remaining portions of the wiring layer 20a are formed on an upper surface of the piezoelectric layer 32a. It should be understood by those of skill in the art, that the wiring layer 20a can be formed by any conventional deposition and patterning processes, within the sequential processing flow of the entire structure. Also, it should be understood by one of skill on the art that FIGS. 9a and 9b are merely illustrative of one particular pattern of the interleaved wiring layers 20a, 20a', and that other configurations are also contemplated by the present invention. For example, in embodiments, the wiring layer 20a can be representative of either the ground electrode or the signal electrode, or portions thereof.

Figure 10:
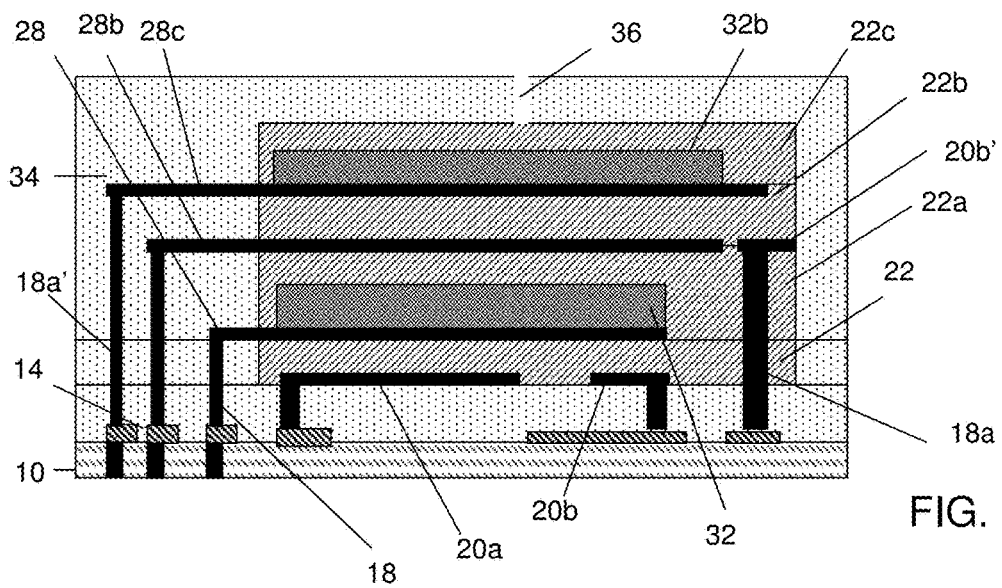
FIGS. 10 and 11 show fabrication processes and respective structures for fabricating an alternative SAW filter structure in accordance with aspects of the present invention.
Figure 11:
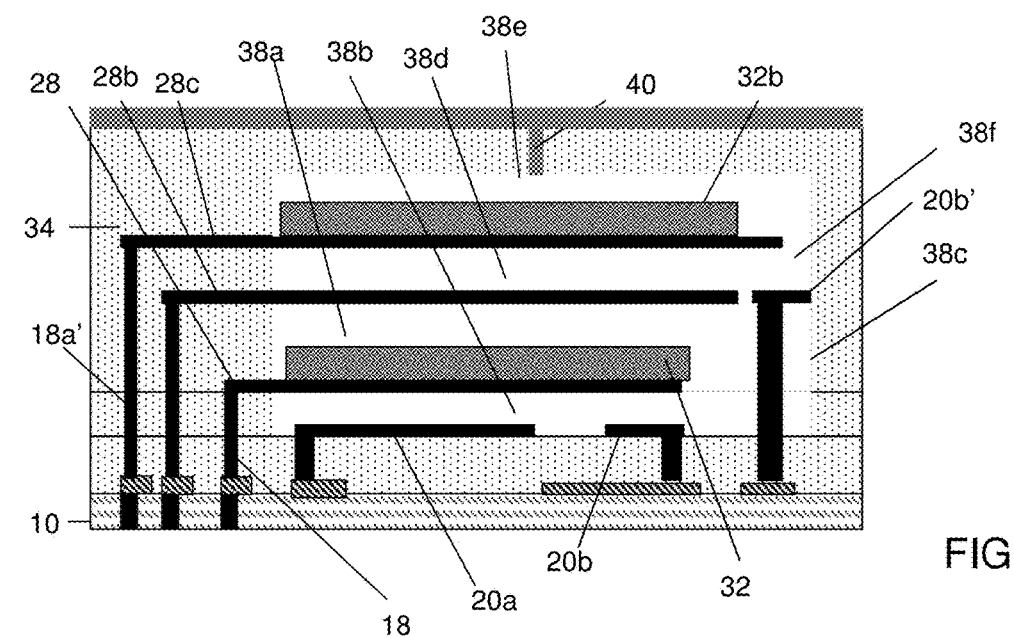

FIGS. 10 and 11 show fabrication processes and respective structures for fabricating an alternative SAW filter structure in accordance with aspects of the present invention. In FIGS. 10 and 11, two SAW filter structures are formed using two separate piezoelectric layers, e.g., piezoelectric layer 32 and piezoelectric layer 32b. In this structure, wiring layer 28 is formed under the piezoelectric layer 32, as discussed with reference to FIGS. 1-4. In addition, a wiring layer 28c is formed under the piezoelectric layer 32b, using similar processes and materials as the wiring layer 28. In embodiments, the wiring layer 28 and 28c are MEMS beam structures, as should be understood by those of skill in the art.

Still referring to FIGS. 10 and 11, a wiring layer 28b is formed between the wiring layer 28c and the piezoelectric layer 32. In embodiments, the wiring layer 28b can be a fixed signal electrode or ground electrode (or both) of the upper SAW filter, e.g., using the piezoelectric layer 32b, formed on the sacrificial layer 22a. In embodiments, the wiring layer 28b can also act as a pull in actuator for the upper MEMS beam 28c at reference numeral 20b'. In embodiments, the wiring layer 28b is formed on the sacrificial layer 22a, using conventional deposition and patterning processes, as described herein.

Prior to the formation of the wiring layer 28b, the sacrificial layers 22 and 22a can be patterned to form an opening, using conventional photolithographic and etching processes. A contact stud 18a is then formed within the opening, to the underlying wiring layer 14. In embodiments, the contact stud 18a can be formed of the same material used to form the contact stud 18. In additional embodiments, the contact stud 18a can be formed through the insulator layers, instead of the sacrificial material, as should be understood by one of skill in the art.

After formation of the wiring layer 28b and actuator 20b', a sacrificial material 22b is formed, e.g., deposited and patterned, on the wiring layer 28b using conventional processes. The sacrificial material 22b can be any sacrificial material already described herein, deposited to a thickness of about 2 microns, although other dimensions are also contemplated by the present invention. A contact stud 18a' can be formed through the several insulator layers to the wiring layer 14, using conventional patterning and deposition processes, as described herein.

The wiring layer 28c is formed on the sacrificial material 22b, in electrical contact with the contact stud 18a. The wiring layer 28c can be patterned to form a beam structure of the MEMS beam. In embodiments, the wiring layer 28c can also be formed as the signal electrode or ground electrode (or both) of the upper SAW filter structure. The piezoelectric layer 32b is formed on the wiring layer 28c, in a manner similar to that of piezoelectric layer 32 such that no further explanation is required herein. A sacrificial material 22c is formed on the piezoelectric layer 32b to a thickness of about 2 microns, although other dimensions are also contemplated by the present invention. An insulator layer 34 is then deposited on the sacrificial layer 22d, with one or more vent holes 36 formed therein.

In FIG. 11, the sacrificial materials are vented through the one or more vent holes 36, to form cavities 38a-38d. The venting can be performed using any stripping techniques that are selective to the sacrificial materials, as already described herein. The one or more vent holes are then sealed using a sealing material 40 such as a dielectric material or metal. It should be understood that the signal electrodes and the ground electrodes can be formed in many different configurations on the piezoelectric substrates as discussed herein. For example, any combination of FIGS. 5a-5d and 9a-9b are contemplated by the present invention for the SAW filter structure shown in FIG. 10, based on the desired patterning processes.

Figure 12:
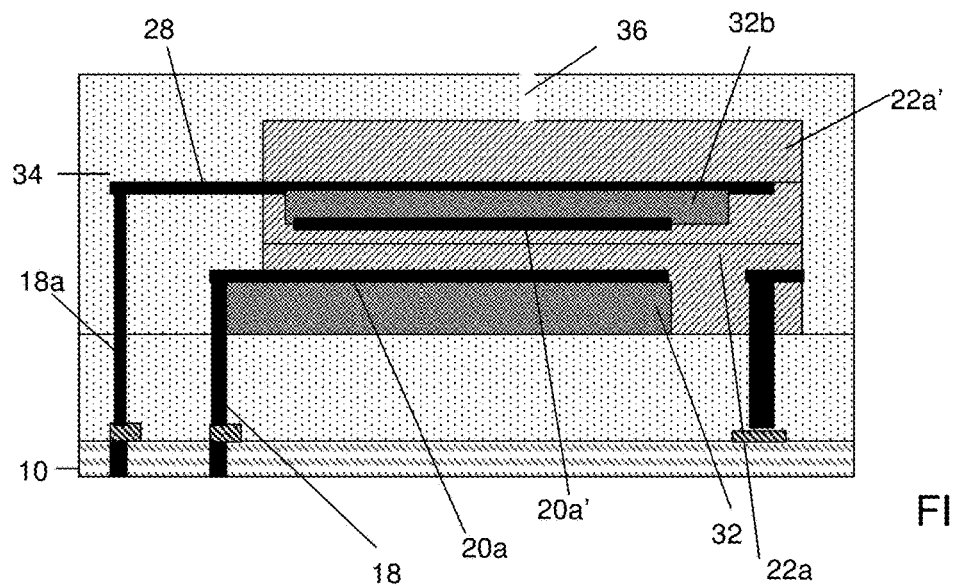
FIGS. 12 and 13 show fabrication processes and respective structures for fabricating an alternative SAW filter structure in accordance with aspects of the present invention.
Figure 13:
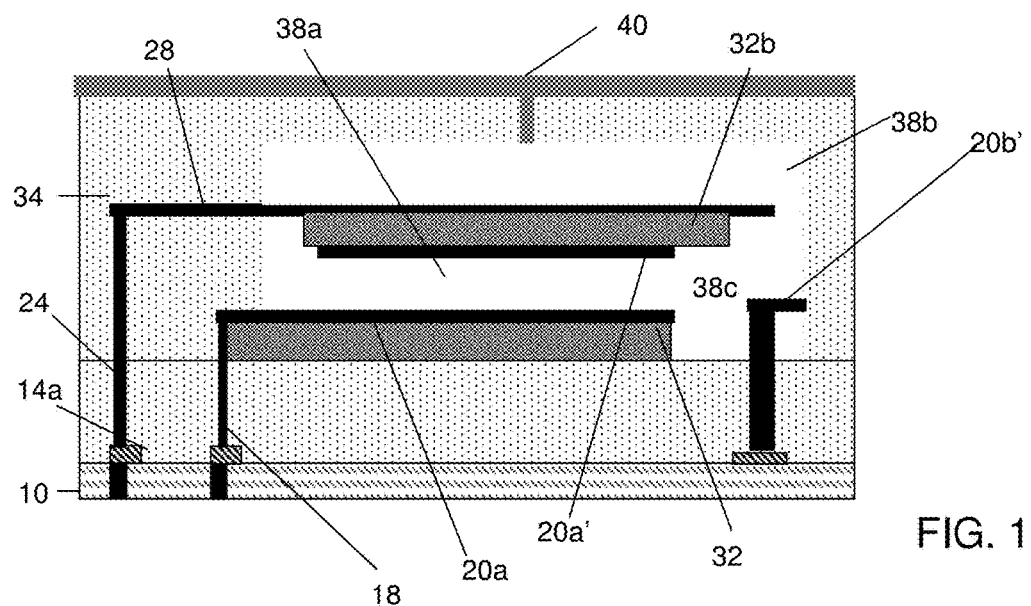

FIGS. 12 and 13 show fabrication processes and respective structures for fabricating an alternative SAW filter structure in accordance with aspects of the present invention. In particular, FIGS. 12 and 13 show the formation of a single SAW filter structure, using two separate piezoelectric layers, e.g., piezoelectric layer 32 and piezoelectric layer 32b. In this structure, wiring layer 20a is formed on an underside surface of the piezoelectric layer 32 and a wiring layer 20a' is formed on a surface of the piezoelectric 32b (over the sacrificial material 22a). As should be understood by those of skill in the art, the wiring layers 20a, 20a' are ground electrodes and signal electrodes formed using conventional deposition and patterning processes as already described herein. Also, the wiring layer 28 is a metal wiring layer, patterned to form the MEMS beam structure. The MEMS beam structure 28 will be pulled in using the actuator 20b'.

In embodiments, the sacrificial layer 22a is formed on the piezoelectric layer 32, in the manner discussed above. Thereafter, the wiring layer 20a' is formed on the sacrificial layer 22a using conventional deposition and patterning processes as already discussed herein. After formation of the wiring layer 20a', the piezoelectric layer 32b is formed on the wiring layer 20a', by a deposition and patterning process as discussed herein. The wiring layer 28, e.g., metal beam, is formed on the piezoelectric layer 32b. The sacrificial material 22a' is formed on the wiring layer 28 and any other exposed surfaces, e.g., sacrificial layer 22a. Insulator layer 34 and the one or more vent holes 36 are then formed, in the manner described herein. The sacrificial material can be vented, and the vent holes 36 sealed with material 40, as described herein.

Figure 14A:
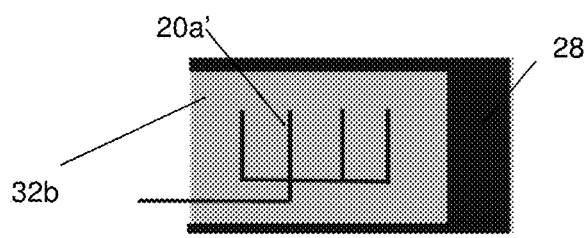
FIGS. 14a and 14b show exploded views of the SAW filter structure of FIG. 13, in accordance with aspects of the present invention.
Figure 14B:
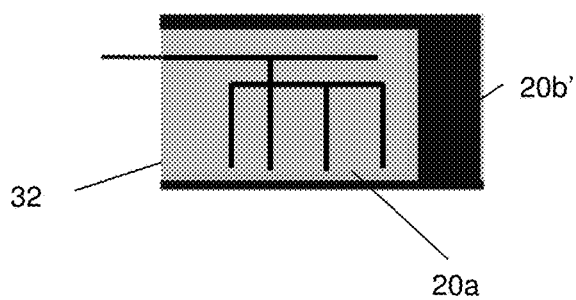

FIGS. 14a and 14b show exploded views of the SAW filter of FIG. 13, in accordance with aspects of the present invention. More specifically, FIG. 14a shows an underside surface of the piezoelectric layer 32b, with the wiring layer 20a' thereon. As further shown in FIG. 14a, the metal beam 28 extends beyond the piezoelectric layer 32b, such that it can be pulled in by the actuator 20b', shown in FIG. 14b. FIG. 14b further shows a top surface of the piezoelectric layer 32, with the wiring layer 20a formed thereon. In this configuration, upon actuation of the MEMS beam structure 28, the piezoelectric layer 32b will move towards the piezoelectric layer 32b, such that the signal electrode and ground electrode 20a, 20a' will become interleaved to form a SAW filter in the "on" state. It should be understood that the signal electrode and the ground electrode can also be formed in many different configurations on the piezoelectric substrates as discussed herein. (See, e.g., 5a-5d and 9a-9b.)

Figure 15:
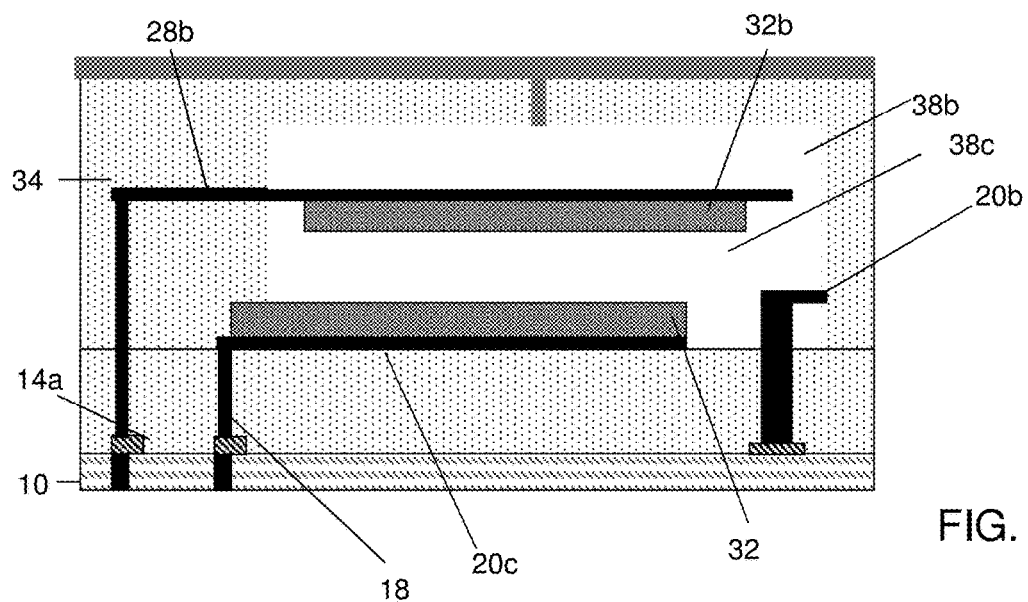
FIG. 15 shows a BAR filter structure and respective fabrication processes in accordance with aspects of the present invention.

FIG. 15 shows a BAW structure and respective fabrication processes in accordance with aspects of the present invention. More specifically, in FIG. 15 piezoelectric layers 32 and 32b are provided on respective surfaces of a metal wiring 20c and 28. In embodiments, the metal wiring 28 is patterned to form a MEMS beam structure. In embodiments, the MEMS beam structure 28 is a metal beam or a metal alloy beam, as should be understood by those of skill in the art (and which can be used in any of the aspects of the present invention). As should be understood by those of skill in the art, in this structure, the piezoelectric layer 32b is formed first, e.g., deposited and patterned on sacrificial material, with the MEMS beam structure 28 formed on the piezoelectric layer 32b. Remaining structures can be formed in the manner as already described herein. In this configuration, upon actuation of the MEMS beam structure 28 will be pulled toward the actuator 20b such that the two piezoelectric layers 32, 32b will become sandwiched between the two electrodes, e.g., MEMS beam structure 28 and electrode 20c.

Figure 16A:
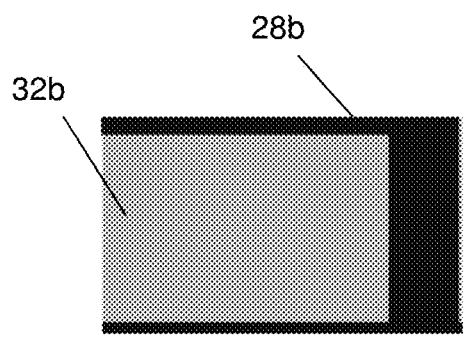
FIGS. 16a-16c show exploded views with alternate configurations of the BAR filter structure of FIG. 15, in accordance with aspects of the present invention.
Figure 16B:
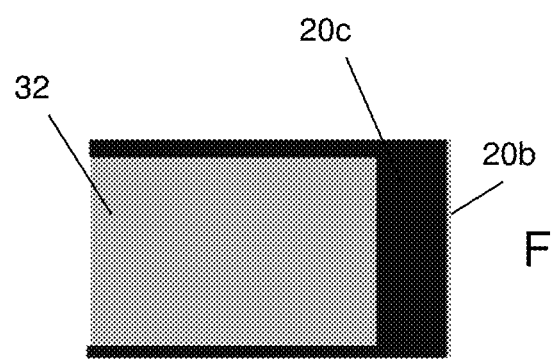
Figure 16C:
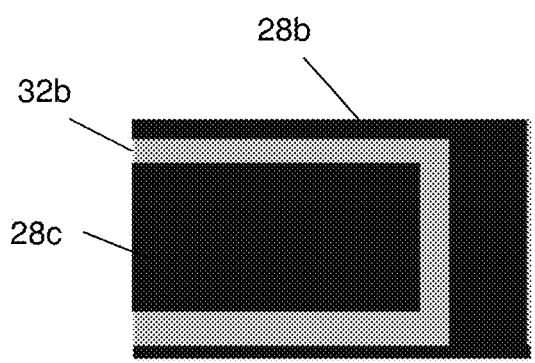

FIGS. 16a-16c show exploded views of alternate structures of the BAW filter structure of FIG. 15. More specifically, in FIG. 16a, the piezoelectric layer 32b is formed under the MEMS beam structure 28b; whereas, in FIG. 16b, the piezoelectric layer 32 is shown to be formed on the metal wiring 20c. It should be understood by those of skill in the art that the view of FIG. 16a is from below the piezoelectric layer 32b, looking upwards; whereas, the view of FIG. 16b is provided from above the piezoelectric layer 32, looking downwards.

In the embodiment shown in FIG. 16c, metal layers 28b, 28c can be formed in a different pattern. It should be understood by those of skill in the art that the view of FIG. 16c is provided from top of the metal layer 28b, looking downwards. In the structure of FIG. 16c, metal pattern 28c can be a mass loading bar. In any of these configurations, upon actuation of the MEMS beam 28b, the piezoelectric layers 32, 32b will become sandwiched between the metal electrodes 28b and 28c to form a BAW filter structure in the "on" state.

Figure 17:
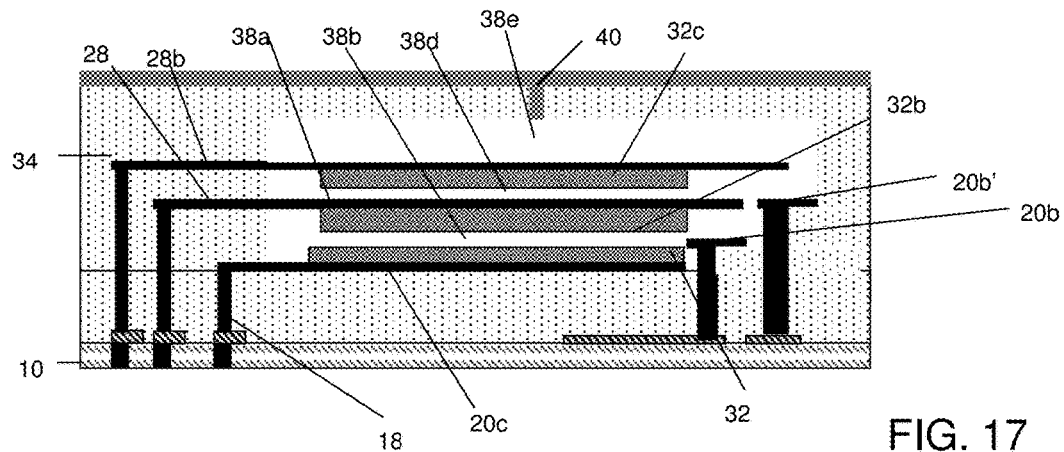
FIGS. 17-21 shows various BAW filter structures and respective fabrication processes in accordance with aspects of the present invention.

FIG. 17 shows multiple BAW filter structures and respective fabrication processes in accordance with aspects of the present invention. In FIG. 17, the multiple BAW filter structures include piezoelectric layers 32, 32b and 32c, provided at different levels of the structure. In embodiments, the piezoelectric layers 32b and 32c are formed on an underside surface of a wiring layer 28 and 28b, respectively, e.g., patterned to form respective MEMS beam structures. The MEMS beam structure 28, 28b are positioned and structured to be facing the respective actuators 20b and 20b', which will pull-in the MEMS beam structures 28, 28c, respectively. In embodiments, the wiring layers 20c, 28 and 28b are respective electrodes for the BAW filter structures. As should be understood by those of skill in the art, each of the MEMS beam structure 28, 28b can be activated independently to provide a particular tuning to the structure of the present invention.

Figure 18:
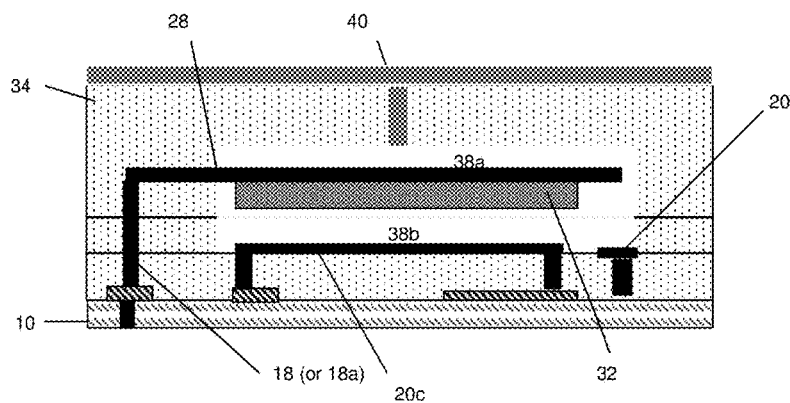

FIG. 18 shows a BAW filter structure with a piezoelectric layer 32 formed on the underside surface of the MEMS beam structure 28. In this structure, the piezoelectric layer 32 is provided on an underside of the MEMS beam structure 28, facing the electrode 20c. The actuator 20b is structured to pull in the MEMS beam structure 28 such that the piezoelectric layer 32 becomes sandwiched between the electrodes, i.e., MEMS beam structure 28 and electrode 20c.

Figure 19:
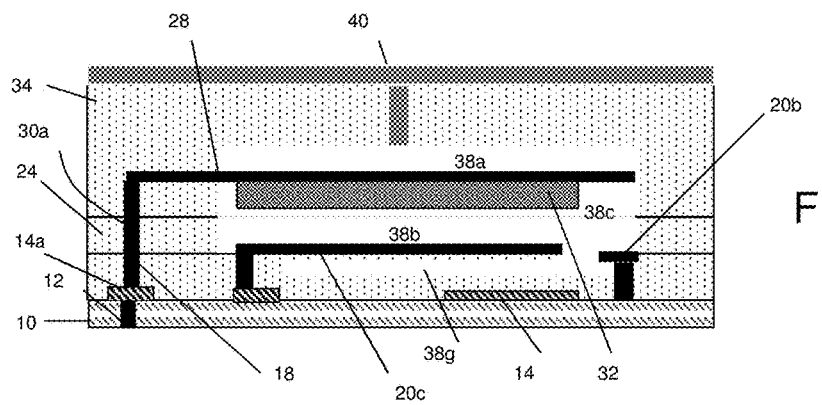

FIG. 19 shows a BAW filter structure with a piezoelectric layer 32 formed on the underside surface of the MEMS beam structure 28. However, in FIG. 19, a cavity 38g is formed under the electrode 20c. This cavity 38g can be formed using a sacrificial material deposition and venting process, as described herein. In this embodiment, the actuator 20b is structured to pull in the MEMS beam structure 28 such that the piezoelectric layer 32 becomes sandwiched between the electrodes, i.e., MEMS beam structure 28 and electrode 20c.

Figure 20:
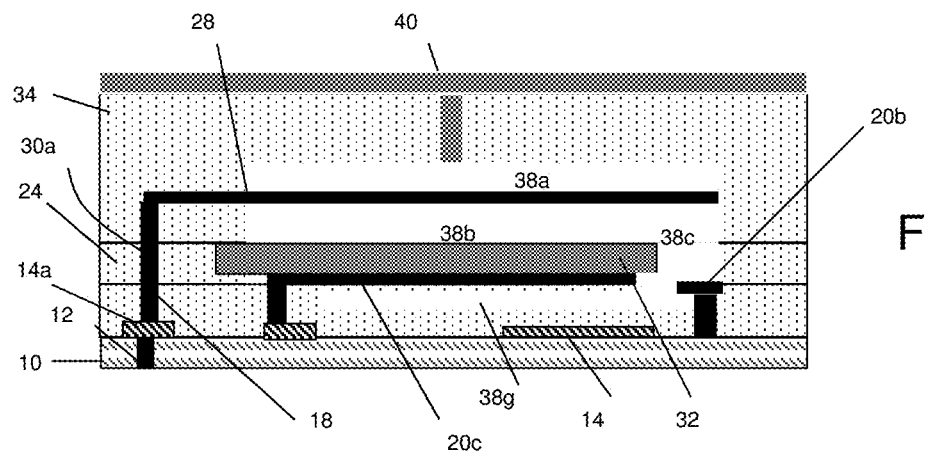

FIG. 20 shows a BAW filter structure with a piezoelectric layer 32 formed on the electrode 20c. The MEMS beam structure 28 is formed over the piezoelectric layer 32. In FIG. 20, the cavity 38g is also formed under the electrode 20c. This cavity 38g can be formed using a sacrificial material deposition and venting process, as described herein. Similar to the embodiment of FIG. 19, in this embodiment, the actuator 20b is structured to pull in the MEMS beam structure 28 such that the piezoelectric layer 32 becomes sandwiched between the electrodes, i.e., MEMS beam structure 28 and electrode 20c.

Figure 21:
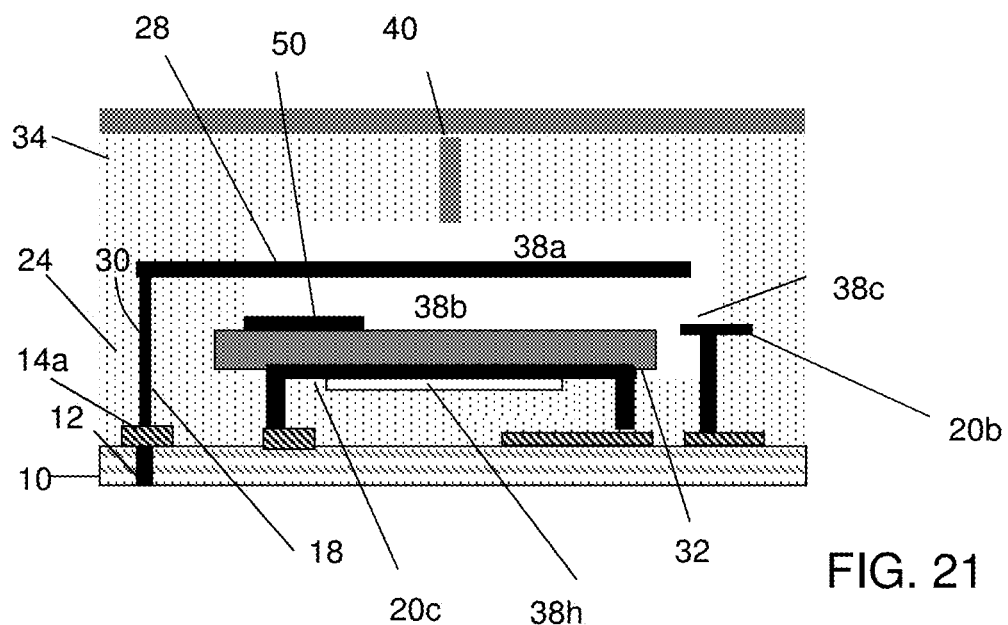

FIG. 21 shows a BAW filter structure with a piezoelectric layer 32 formed on the electrode 20c. In this embodiment, a loading bar 50 is formed on the piezoelectric layer 32. The loading bar 50 can be, for example, a dielectric material or a metal material, formed using conventional deposition and patterning processes. The MEMS beam structure 28 is formed over the piezoelectric layer 32. In FIG. 21, a cavity 38h is also formed under the electrode 20c. This cavity 38h can be formed using an etching processes, e.g., etching a shallow trench in the insulator layer 14 such that the MEMS beam structure 28 can now be supported at both ends. It is also contemplated that the cavity 38h can be formed in the same configuration as that shown in FIG. 20.

A method of using the filter structures of the present invention include determining a frequency of a filter or need to have the filter activated. In response to the determining, the method includes turning on one or more filters by actuating a MEMS beam by interleaving electrodes in contact with the piezoelectric substrate or sandwiching the at least one piezoelectric substrate between the electrodes.

Figure 22:
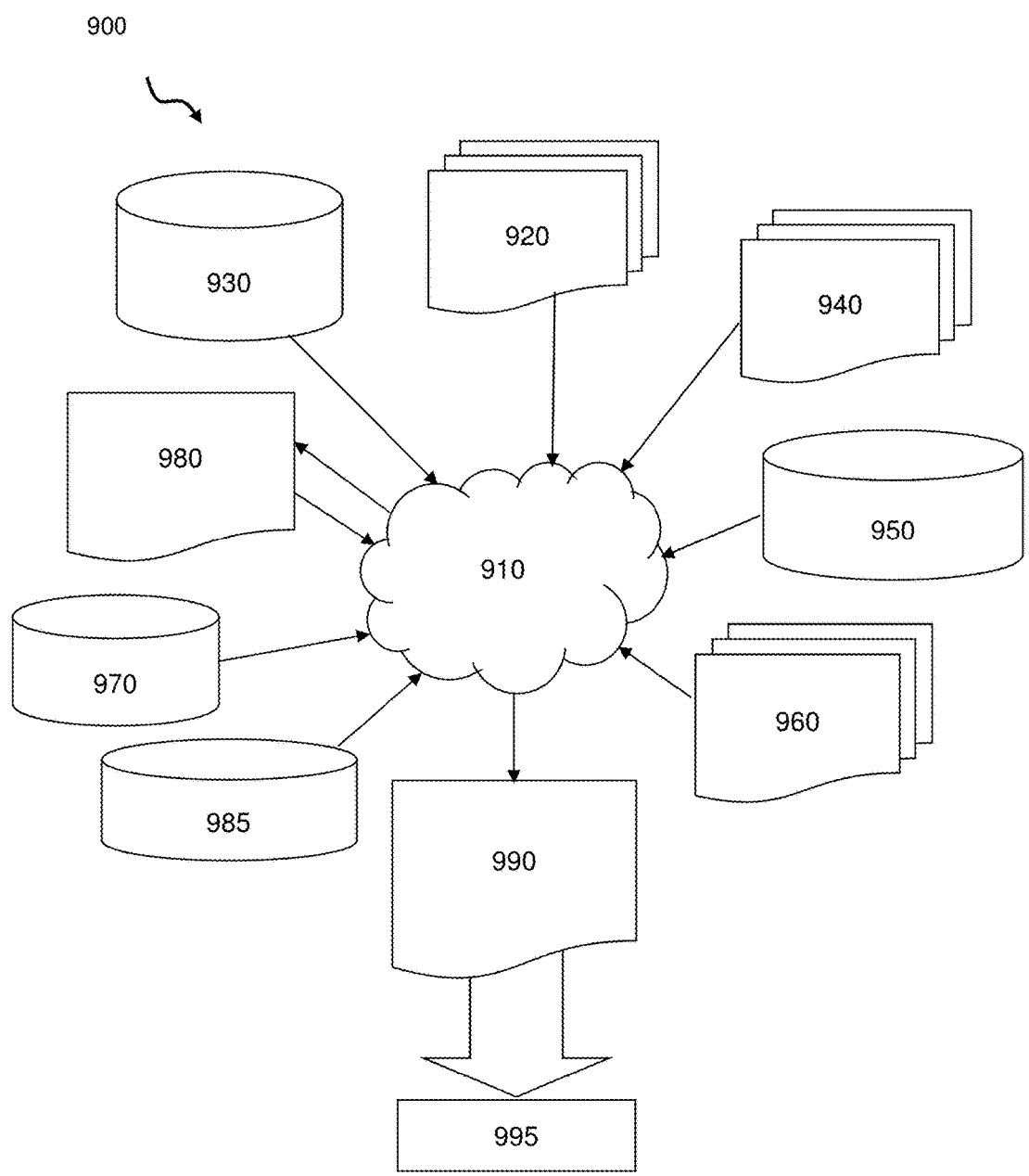
FIG. 22 is a flow diagram of a design process used in semiconductor design, manufacture, and/or test.

FIG. 22 is a flow diagram of a design process used in semiconductor design, manufacture, and/or test. FIG. 22 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-4, 5a-5d, 6, 7a,7b, 8, 9a, 9b, 10-13, 14a, 14b, 15, 16a-16c, and 17-21. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 22 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4, 5a-5d, 6, 7a,7b, 8, 9a, 9b, 10-13, 14a, 14b, 15, 16a-16c, and 17-21. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design.

Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4, 5a-5d, 6, 7a,7b, 8, 9a, 9b, 10-13, 14a, 14b, 15, 16a-16c, and 17-21 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4, 5a-5d, 6, 7a,7b, 8, 9a, 9b, 10-13, 14a, 14b, 15, 16a-16c, and 17-21. In one embodiment, design structure 990 may comprise a compiled, executable HDL simulation model that functionally simulates the devices shown in FIGS. 1-4, 5a-5d, 6, 7a,7b, 8, 9a, 9b, 10-13, 14a, 14b, 15, 16a-16c, and 17-21.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4, 5a-5d, 6, 7a,7b, 8, 9a, 9b, 10-13, 14a, 14b, 15, 16a-16c, and 17-21. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A filter comprising:
a piezoelectric layer,
a ground electrode on an underside of an insulator layer
a beam structure over the piezoelectric layer and surrounding the ground electrode;

a signal wiring layer provided on the piezoelectric layer; and an actuator aligned with the beam structure.

2. The filter of claim 1, wherein, upon actuation of the beam structure, the signal electrode becomes interleaved with the ground electrode to form a SAW filter in the "on" state.

3. The filter of claim 1, wherein the beam structure and the ground electrode are both ground.

4. The filter of claim 1, wherein the ground electrode is a wiring layer.

5. The filter of claim 4, wherein the ground electrode is within an opening of the beam structure.

6. The filter of claim 4, wherein the ground electrode is suspended within the opening of the beam structure.

7. The filter of claim 1, wherein the beam structure is a MEMS beam structure.

8. The filter of claim 1, wherein, upon actuation of the beam structure, the signal electrode becomes interleaved with the ground electrode within a same plane.

9. The filter of claim 1, wherein beam structure is surrounded by an upper cavity and a lower cavity.

10. The filter of claim 1, wherein the piezoelectric layer is on insulator material.

11. The filter of claim 1, wherein the piezoelectric layer is composed of one of AlN, ZnO, quartz, $LiNbo_3$, $LiTiO_3$, $Pb(Zr_xTi_{1x})O_3$, $PbTiO_3$, $PVD-[Ch_2-CF_2]_n$ or PVDF and PZT materials.

12. The filter of claim 1, wherein the actuator is a fixed actuator below the beam structure.

* * * * *